United States Patent [19]

Yokoyama et al.

[11] Patent Number: 5,027,179

[45] Date of Patent: Jun. 25, 1991

[54] RESONANT-TUNNELING HETEROJUNCTION BIPOLAR TRANSISTOR DEVICE

[75] Inventors: Naoki Yokoyama; Kenichi Imamura, both of Atsugi, Japan

[73] Assignee: Fujitsu Limited, Kawasaki, Japan

[21] Appl. No.: 601,011

[22] Filed: Oct. 22, 1990

Related U.S. Application Data

[63] Continuation of Ser. No. 293,586, Jan. 4, 1989, abandoned, which is a continuation of Ser. No. 937,615, Dec. 3, 1986, abandoned.

[30] Foreign Application Priority Data

Dec. 3, 1985 [JP] Japan ................................. 60-270803

[51] Int. Cl.$^5$ ..................... H01L 29/72; H01L 27/12; H01L 29/161
[52] U.S. Cl. .......................................... 357/34; 357/4; 357/16
[58] Field of Search ..................... 357/45 L, 35, 34, 4, 357/16, 34 HB

[56] References Cited

U.S. PATENT DOCUMENTS

| | | | |
|---|---|---|---|
| 4,712,121 | 12/1987 | Yokoyama | 357/34 |
| 4,785,340 | 11/1988 | Nakagawa et al. | 357/35 |

FOREIGN PATENT DOCUMENTS

| | | | |
|---|---|---|---|
| 0133342 | 2/1985 | European Pat. Off. | |
| 59-211265 | 11/1984 | Japan | 357/34 |
| 59-211266 | 11/1984 | Japan | 357/34 |
| 60-175450 | 9/1985 | Japan | 357/4 SL |
| 61-216468 | 9/1986 | Japan | 357/34 HB |
| 61-224365 | 10/1986 | Japan | 357/34 HB |

OTHER PUBLICATIONS

Asbeck et al., "Ga,Al/As/GaAs Bipolar Transistors for Digital Integrated Circuits", International Electron Devices Meeting, pp. 629 to 632, Dec. 1981.
Japanese Journal of Applied Physics, vol. 24, No. 11, Nov. 1985, pp. L853–L854, Tokyo, JP; N. Yokoyama et al.: "A New Functional Resonant-Tunneling Hot Electron Transistor (RHET)".
Journal of Applied Physics, vol. 54, No. 11, Nov. 1983, pp. 6725–6731, American Institute of Physics, New York, U.S.; S. L. Su et al.: "Double Heterojunction GaAs/AlxGal-xAs Bipolar Transistors Prepared by Molecular Beam Epitaxy".
Journal of Applied Physics, vol. 58, No. 3, Aug. 1, 1985, pp. 1366–1368, American Institute of Physics, New York, U.S.; F. Capasso et al.: "Resonant Tunneling Transistor with Quantum Well Base and High-Energy Injection: A New Negative Differential Resistance Device".
Patent Abstracts of Japan, vol. 7, No. 222 (E-201) [1367], Oct. 4, 1983; and JP-A-58 114 455 (Nippon Denki K.K.) 7-7-83.
Applied Physics Letters, vol. 47, No. 4, Aug. 1985, pp. 415–417, American Institute of Physics, New York, U.S.; E. E. Mendez et al.: "Resonant Tunneling of Holes in AlAs–GaAs–AlAs Heterostructures".

*Primary Examiner*—Andrew J. James
*Assistant Examiner*—Ngan Van Ngo
*Attorney, Agent, or Firm*—Staas & Halsey

[57] ABSTRACT

A resonant-tunneling heterojunction bipolar transistor (RHBT) device having a superlattice structure and a PN junction. The RHBT includes an emitter layer, a base layer, a collector layer facing the base layer to form a PN junction at the interface between the base layer and the collector layer, and a superlattice structure including at least one quantum well defining a sub-band of energy at which carriers resonant-tunnel therethrough. The superlattice is formed at least in the emitter layer and faces. The RHBT has a differential negative resistance characteristic for realizing a variety of logic circuits and includes an electron resonance and a positive hole resonance, for which the generation condition is changeable in response to a mole fraction of material of the emitter layer.

10 Claims, 13 Drawing Sheets

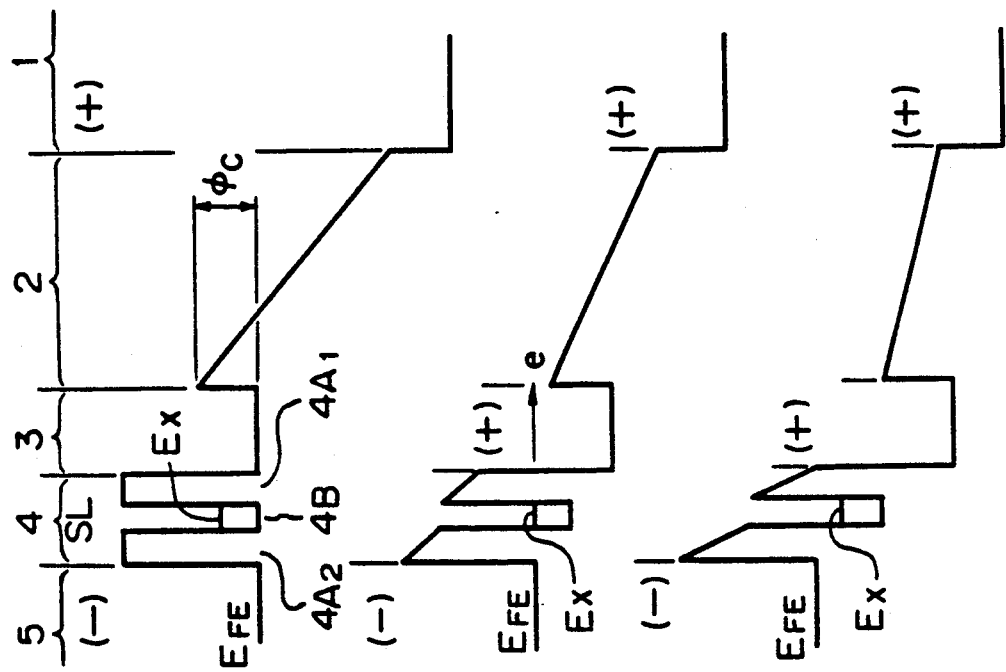
Fig. 2a  $V_{BE} < 2E_x/q$
PRIOR ART
Fig. 2b  $V_{BE} \simeq 2E_x/q$
PRIOR ART
Fig. 2c  $V_{BE} > 2E_x/q$
PRIOR ART

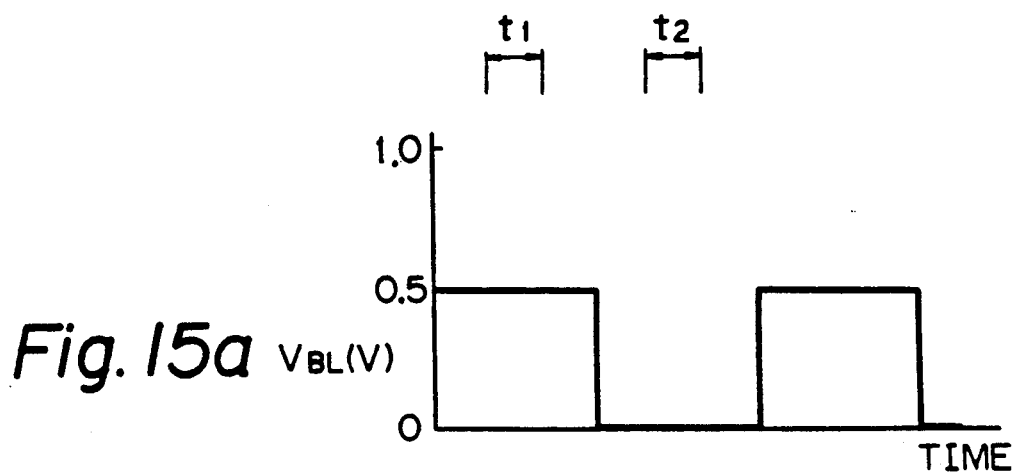
Fig. 15a $V_{BL}(V)$
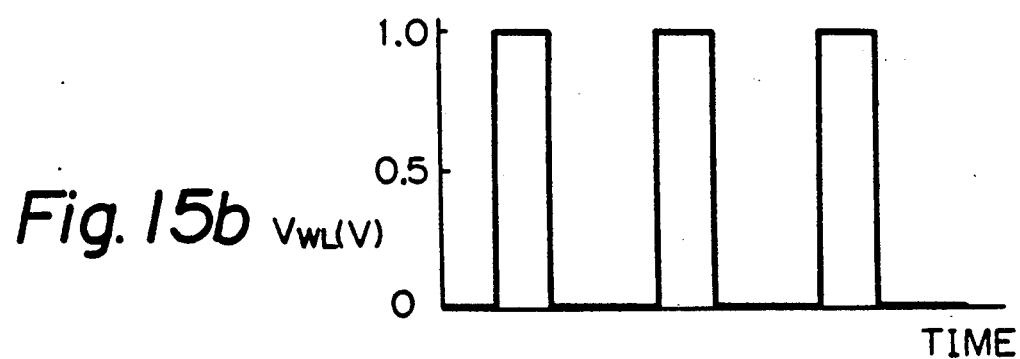
Fig. 15b $V_{WL}(V)$
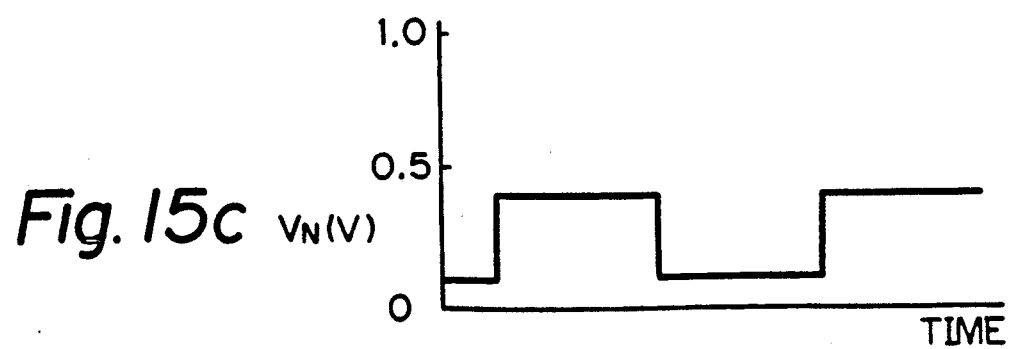
Fig. 15c $V_N(V)$

RESONANT-TUNNELING HETEROJUNCTION BIPOLAR TRANSISTOR DEVICE

This is a continuation of application Ser. No. 07/293,586, filed on Jan. 4, 1989, now abandoned, which is a continuation of application Ser. No. 937,615, filed Dec. 3, 1986, now abandoned.

BACKGROUND OF THE INVENTION

1. Field of the Invention

The present invention relates to a resonant-tunneling heterojunction bipolar transistor (RHBT), having a superlattice structure between an emitter and a base, through which carriers are resonant-tunneled, and having a PN junction between the base and a collector.

2. Description of the Related Art

The resonant-tunneling phenomena has been long known, and recently, due to advances in semiconductor processing technology, such as molecular beam epitaxy (MBE) and metal organic chemical vapor deposition (MOCVD), practical RHETs have been realized (e.g., "A NEW FUNCTIONAL, RESONANT-TUNNELING HOT ELECTRON TRANSISTOR (RHET)", N. Yokoyama, et al, Japanese Journal of Applied Physics, Vol. 24, No. 11, November, 1985, pp. L853-L854). The RHET includes a superlattice structure between an n-type emitter and an n-type base and a collector barrier between the n-type base and an n-type collector. The RHET has negative differential resistance characteristics, and accordingly, can be used for ternary logic circuits with a high speed, a compact circuit arrangement, and a large margin, etc., such as, tristable gate circuits or a tristate memory cell. However, the RHET suffers from the disadvantages of a poor current gain and the impossibility of operation under a normal temperature, due to the existence of the collector barrier provided to give the tolerance to the reverse voltage. The above disadvantages will be described later in detail with reference to specific examples.

In addition, another type of resonant-tunneling transistor including a superlattice structure in a base, not between an emitter and the base as set forth above, is known (e.g., "Resonant tunneling transistor with quantum well base and high-energy injection: A new negative differential resistance device, F. Capasso, et al, J. Appl. Phys. 53(3), August 1985, PP. 1366-1368). However, in this resonant-tunneling transistor, electrons from the emitter must be ballistically launched at the base and pass into a narrow sub-band in the superlattice structure, and consequently, this transistor is also subjected to a low current gain.

SUMMARY OF THE INVENTION

An object of the present invention is to provide a resonant-tunneling transistor having an improved current gain.

Another object of the present invention is to provide a resonant-tunneling transistor stably operable in a normal ambient temperature.

Still another object of the present invention is to provide a resonant-tunneling transistor having suitable negative differential resistance characteristics and applicable to the forming of a variety of circuits.

Yet another object of the present invention is to provide a resonant-tunneling transistor providing new functions by adjusting the composition of the materials therefor.

According to the present invention, there is provided a resonant-tunneling heterojunction bipolar transistor device including: an emitter layer; a base layer; a collector layer facing the base layer to form a PN junction at the face between the base layer and the collector layer; and a superlattice structure including at least one quantum well defining a sub-band of energy at which carriers resonant-tunnel therethrough, formed at least in the emitter layer and operatively facing the base layer.

The superlattice structure may be formed between the emitter layer and the base layer.

According to the present invention, an n-p-n transistor device can be formed, or conversely, a p-n-p transistor device can be formed. The superlattice structure and the PN junction between the base layer and the collector layer are provided in both of these transistor devices.

The resonance may include a resonance of electrons and a resonance of positive holes. The generation condition of the electron resonance and the positive hole resonance is changed in response to a mole fraction of the material in the emitter layer.

The resonant-tunneling heterojunction bipolar transistor device may have a base negative differential resistance (NDR) characteristic with at least one resonant point in a relationship between a current flowing in and said base layer and a voltage between the base and emitter layers, and having at least two stable base current values at both sides of the resonant point on the NDR characteristic, defined by the changeable base emitter voltage.

The NDR can be used for a variety of logic circuits. A logic circuit may include the resonant tunneling hetero junction bipolar transistor device; a current source ohmically-connected to the base layer of the transistor device and supplying a constant current to the base layer; a load circuit ohmically-connected to the collector layer of the transistor device; and an output circuit operatively connected to a commonly connection point of the load circuit and the collector layer, for outputting a voltage defined by a change of a current flowing through the collector layer. The voltage is varied in response to the two stable base current values.

The resonant-tunneling hetero junction bipolar transistor device may also have a collector differential negative-resistance characteristic with at least one resonant point in a relationship between a current flowing in and the collector layer and a voltage between the base and emitter layers, and having at least two stable collector current values at both sides of the resonant point on the characteristic, defined by the changeable base emitter voltage. This NDR can be used for a variety of logic circuits.

The logic circuit may include the resonant-tunneling hetero junction bipolar transistor device, at least two input resistors operatively connected to the base layer of the transistor device, and an output resistor operatively connected to the collector layer of the transistor device.

BRIEF DESCRIPTION OF THE DRAWINGS

Other objects and features of the present invention will be described below in detail with reference to the accompanying drawings, in which:

FIGS. 2a to 2c are graphs illustrating an energy state digrams of the RHET shown in FIG. 1a;

FIGS. 15a to 15c are timing diagrams of the operation of the memory cell shown in FIG. 13;

DESCRIPTION OF THE PREFERRED EMBODIMENTS

Before describing the preferred embodiments of the present invention, a description will be given of a resonant-tunneling hot electron transistor (RHET).

Figure 1B:
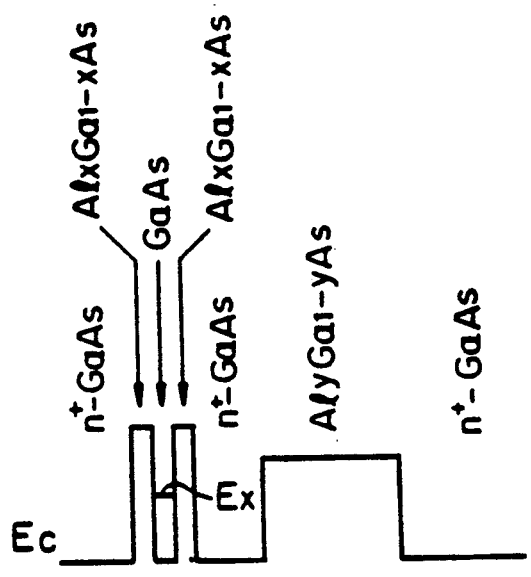
FIGS. 1a and 1b are a cross-section structure and an energy state diagram of a resonant-tunneling hot electron transistor (RHET)
Figure 1A:
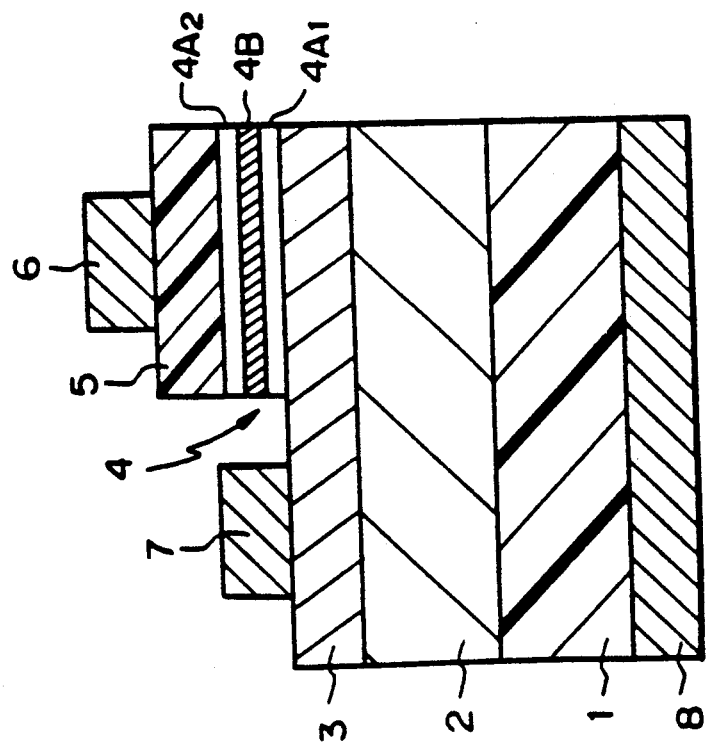

FIG. 1a is a sectional view of a semifinished RHET device, and FIG. 1b is a graph of an energy band of the RHET device in FIG. 1a. In FIG. 1a, the resonant-tunneling transistor device includes a collector electrode 8, an n+-type GaAs collector layer 1, formed on the collector electrode 8, a non-doped impurity $Al_yGa_{1-y}As$ (e.g. y=0.3) collector side potential barrier layer 2 formed on the collector layer 1, an n+-type GaAs base layer 3, formed on the potential barrier layer 2, a superlattice layer 4, an n+-type GaAs emitter layer 5, an emitter electrode 6, and a base electrode 7. The superlattice layer 4 includes an $Al_xGa_{1-x}As$ barrier layer $4A_1$, a non-doped impurity GaAs quantum well layer 4B, and an $Al_xGa_{1-x}As$ barrier layer $4A_2$. The superlattice layer 4 functions as an emitter side potential barrier. In this specification, the superlattice is defined such that at least one quantum well is provided therein. In FIG. 1a, a plurality of quantum wells may be formed.

In FIG. 1b, reference $E_C$ represents a bottom of a conduction-energy band, and $E_X$ represents an energy level of a sub-band at the quantum well.

The principle of operation of the resonant-tunneling transistor device will be described with reference to FIGS. 2a-2c.

FIG. 2a is a graph of an energy band of the RHET device when a voltage $V_{BE}$ between the base layer 3 and the emitter layer 5 is lower than $2 \cdot E_X/q$, wherein q represents the charge of carriers, and $V_{BE}$ is too low, for example, approximately zero volts. In FIG. 2a, although a voltage $V_{CE}$ exists between the collector layer 1 and the collector layer 3, electrons at the emitter layer 5 cannot reach the base layer 3 by tunneling through the superlattice layer 4, since the base emitter voltage $V_{BE}$ is almost zero, and thus an energy level $E_{FE}$, namely a quasi-Fermi level, of the emitter layer 5 differs from the energy level $E_X$ at the sub-band. Accordingly, a current does not flow between the emitter layer 5 and the collector layer 1. Reference $\phi_C$ represents a conduction-band discontinuity.

FIG. 2b is a graph of an energy band of the RHET device when the base.emitter voltage $V_{BE}$ is approximately equal to $2 \cdot E_X/q$. In FIG. 2b, the energy level $E_{FE}$ at the emitter layer 5 is substantially equal to the energy level $E_X$ of the sub-band at the quantum well layer 4B. As a result, due to a resonant-tunneling effect, electrons at the emitter layer 5 are passed through the superlattice layer 4 and injected into the base layer 3. The potential energy of the injected electrons, for example, 0.3 eV, is converted to kinetic energy, bringing the electrons to a so-called "hot" state. The hot electrons are ballistically passed through the base layer 3 and reach the collector layer 1. As a result, a current flows between the emitter layer 5 and the collector layer 1.

FIG. 2c is a graph of an energy band of the RHET device when the base.emitter voltage $V_{BE}$ is higher than $2 \cdot E_X/q$. In FIG. 2c, the energy level $E_{FE}$ at the emitter layer 5 is higher than the energy level $E_X$ of the sub-band at the quantum well layer 4B. The resonant-tunneling effect does not occur, and the electrons introduced from the emitter layer 5 to the base layer 3 do not exist. Consequently, the current flowing into the RHET device is reduced. On the other hand, by decreasing the barrier height of the barrier layer $4A_1$ adjacent to the base layer 3 to a suitable value, the electrons may be directly tunneled through the barrier layer $4A_2$ adjacent to the emitter layer 5. As a result, a certain amount of collector current may flow.

Figure 3:
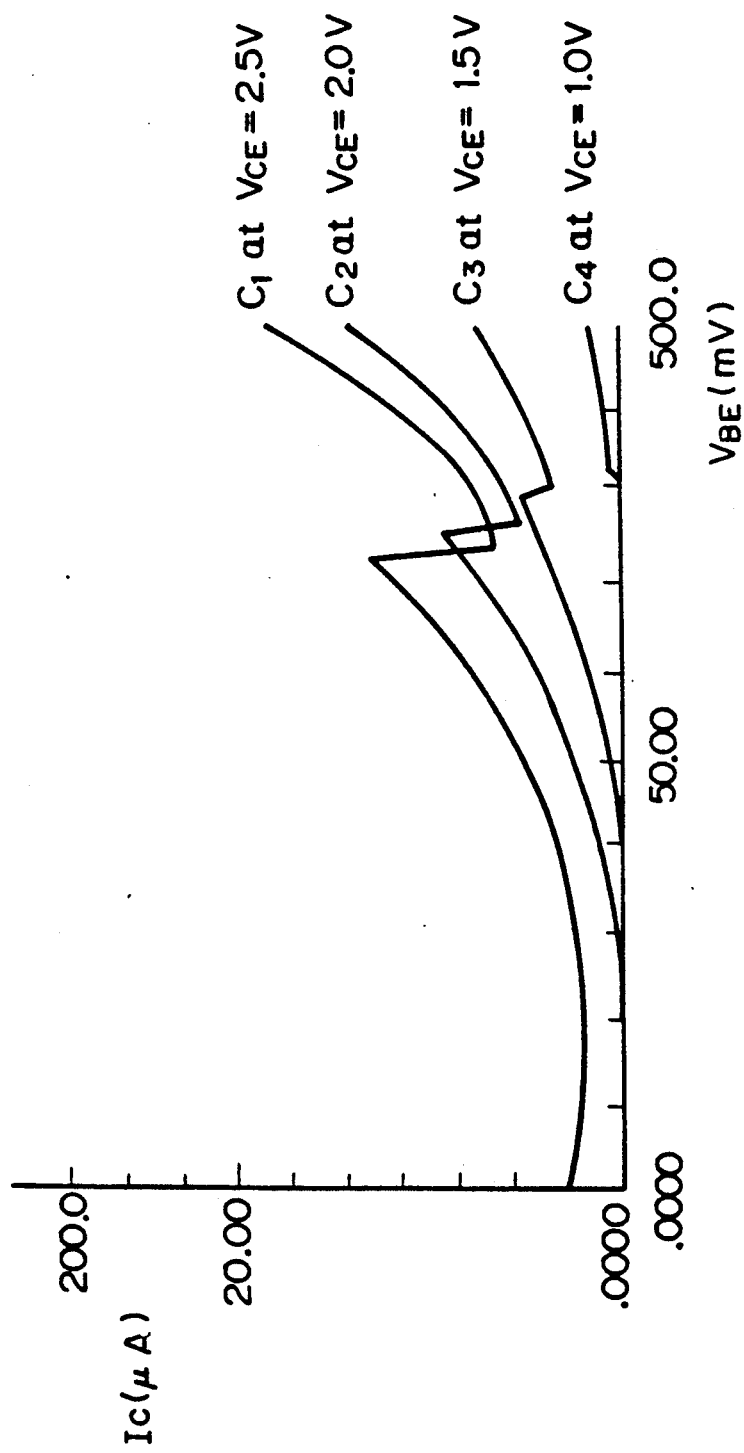
FIG. 3 is a graph of the negative differential resistance characteristics of the RHET.

FIG. 3 is a graph representing the characteristics the RHET device set forth above. In FIG. 3, the abscissa indicates the base emitter voltage $V_{BE}$ and the ordinate indicates the collector current $I_C$. Curves $C_1$ to $C_4$ represent the characteristics when the collector-emitter voltage $V_{CE}$ are respectively 2.5 V, 2.0 V, 1.5 V, and 1.0 V.

The curves also indicate n-shaped differential negative-resistance (NDR) characteristics. By using this feature, a variety of circuits, such as ternary logic circuits, can be realized.

The above RHET device is composed of a hetero junction n-type emitter, n-type base and n-type collector, and therefore, a collector potential barrier must be provided between the base and the collector to supplying the tolerance to the voltage, i.e., the insulation. Because of the collector potential barrier, the RHET device suffers from troublesome defects. Namely, a low current gain exists because most of the electrons, which are emitted from the emitter layer to the superlattice layer resonant-tunneled and injected to the base in a hot state, are affected by a phonon scattering, e.g. an optical phonon scattering, an intervalley scattering in the base layer, and accordingly, they can not go over the collector potential barrier. On the other hand, to provide sufficient isolation, the collector potential barrier must be thick and high. In normal ambient (room) temperature, the height of the collector potential barrier is low. In addition, when the collector potential barrier is low, considerable thermionic emission may occur, and thus the RHET device may not perform as a normal transistor. If the collector potential barrier is high, electrons can not always reach the collector, resulting in a low current gain. In order to overcome this defect, an energy of the electrons must be raised, but this is subject to an intervalley scattering, also resulting in a low current gain. As a result, the RHET device can not be substantially operated at normal ambient temperature and must be super-cooled by, for example, liquid nitrogen.

Preferred embodiments of the present invention will now be described.

Figure 4:
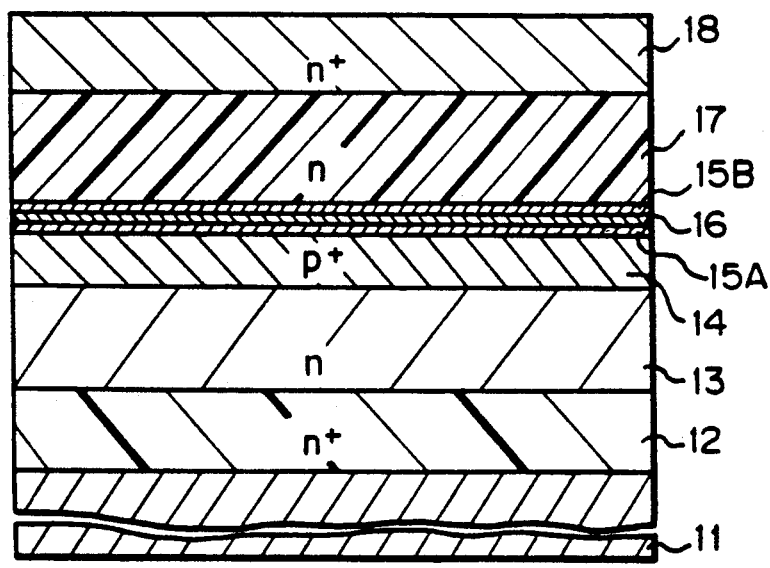
FIG. 4 is a sectional view of a semiconductor wafer of a resonant-tunneling hetero junction bipolar transistor (RHBT) of according to an embodiment of the present invention.
Figure 5:
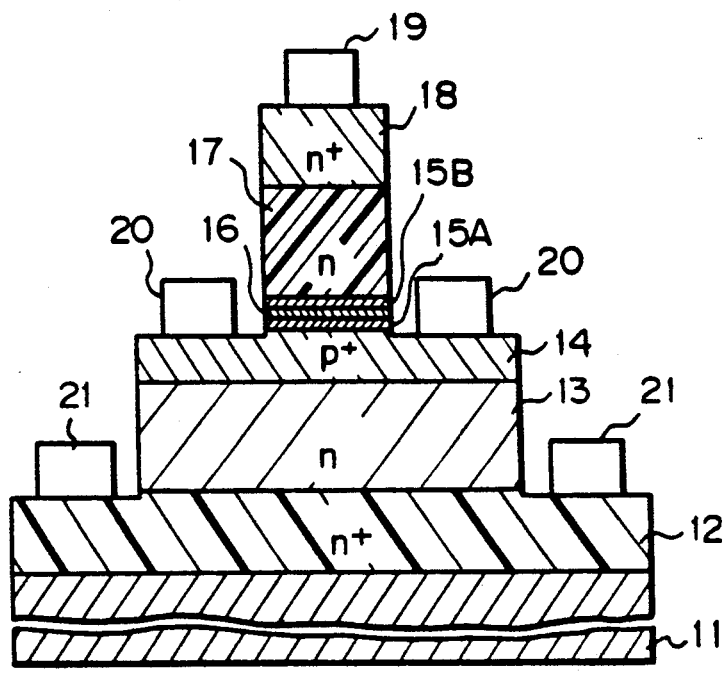
FIG. 5 is a sectional view of a semi-finished RHBT device of FIG. 4.
Figure 6:
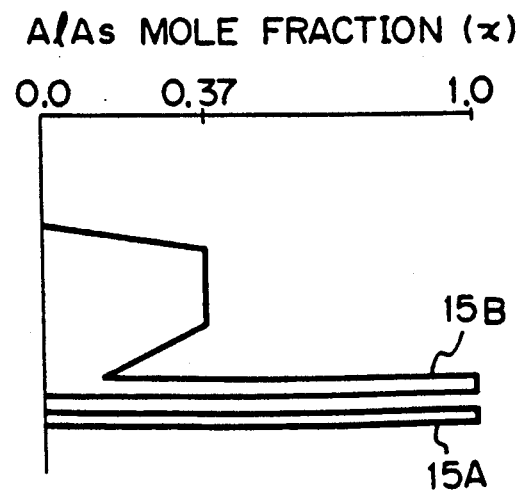
FIG. 6 is a graph of a profile of the AlAs composition of the RHBT device shown in FIG. 5.

FIG. 4 is a sectional view of a semiconductor wafer of a resonant-tunneling hetero junction bipolar transistor (RHBT) according to an embodiment of the present invention. FIG. 5 is a sectional view of a semifinished RHBT device of FIG. 4. FIG. 6 is a graph of a profile of the AlAs composition of the RHBT device shown in FIG. 5. In FIGS. 4 and 5, the RHBT includes of a substrate 11 made of GaAs and having a semi-isolation property, an n+-type collector contact layer 12 formed of GaAs, an n-type collector layer 13 formed of GaAs, a p+-type base layer 14 formed of GaAs, a barrier layer 15A formed of $Al_yGa_{1-y}As$, a quantum well layer 16 formed of GaAs, a barrier layer 15B formed of $Al_yGa_{1-y}As$, an n-type emitter layer 17 formed of $Al_xGa_{1-x}As$, and an n+-type emitter contact layer 18 formed of GaAs. The RHBT is provided with an emitter electrode 19 ohmic-connected to the emitter layer 18, base electrodes 20 ohmically-connected to the base layer 14, and collector electrodes 21 ohmically-connected to the collector layer 13.

The parameters of the above elements are as follows:

| | |
|---|---|
| (1) Collector contact layer 12 | |
| thickness | 200 nm (2000 Å) |
| impurity density | $5 \times 10^{24}/m^3$ ($5 \times 10^{18}/cm^3$) |
| (2) Collector layer 13 | |
| thickness | 300 nm (3000 Å) |
| impurity density | $1 \times 10^{23}/m^3$ ($1 \times 10^{17}/cm^3$) |
| (3) base layer 14 | |
| thickness | 100 nm (1000 Å) |
| impurity density | $5 \times 10^{24}/m^3$ ($5 \times 10^{18}/cm^3$) |
| (4) barrier layers 15A and 15B | |
| thickness | 5 nm (50 Å) |
| y | 0.3 |
| (5) quantum well layer 16 | |
| thickness | 5 nm (50 Å) |
| (6) emitter layer 17 | |
| thickness | 300 nm (3000 Å) |
| impurity density | $1 \times 10^{23}/m^3$ ($1 \times 10^{17}/cm^3$) |
| x | 0.37 |
| (7) emitter contact layer 18 | |
| thickness | 200 to 300 nm (2000 to 3000 Å) |
| impurity density | $6 \times 10^{24}/m^3$ ($6 \times 10^{18}/cm^3$) |
| (8) emitter electrode 19 | |
| a. material | Au.Ge |
| thickness | 30 nm (300 Å) |
| b. material | Au |
| thickness | 300 nm (3000 Å) |
| (9) base electrode 20 | |
| a. material | Cr |
| thickness | 30 nm (300 Å) |
| b. material | Au |
| thickness | 300 nm (3000 Å) |
| (10) Collector electrode 21 | |
| a. material | Au.Ge |
| thickness | 30 nm (300 Å) |
| b. material | Au |
| thickness | 300 nm (3000 Å) |

The AlAs mole fraction x of the emitter layer 17 is 0.37, and the AlAs mole fraction near the emitter layer side 17 of the quantum well layer 16 is graded from 0.37 to 0.14. Accordingly, the energy of the conduction band edge of the emitter side 17 of the quantum well layer 16 is substantially equal to the resonant energy level. This superlattice structure was grown successively on the n+-type AlAs substrate at 580° C. by MBE.

Figure 7:
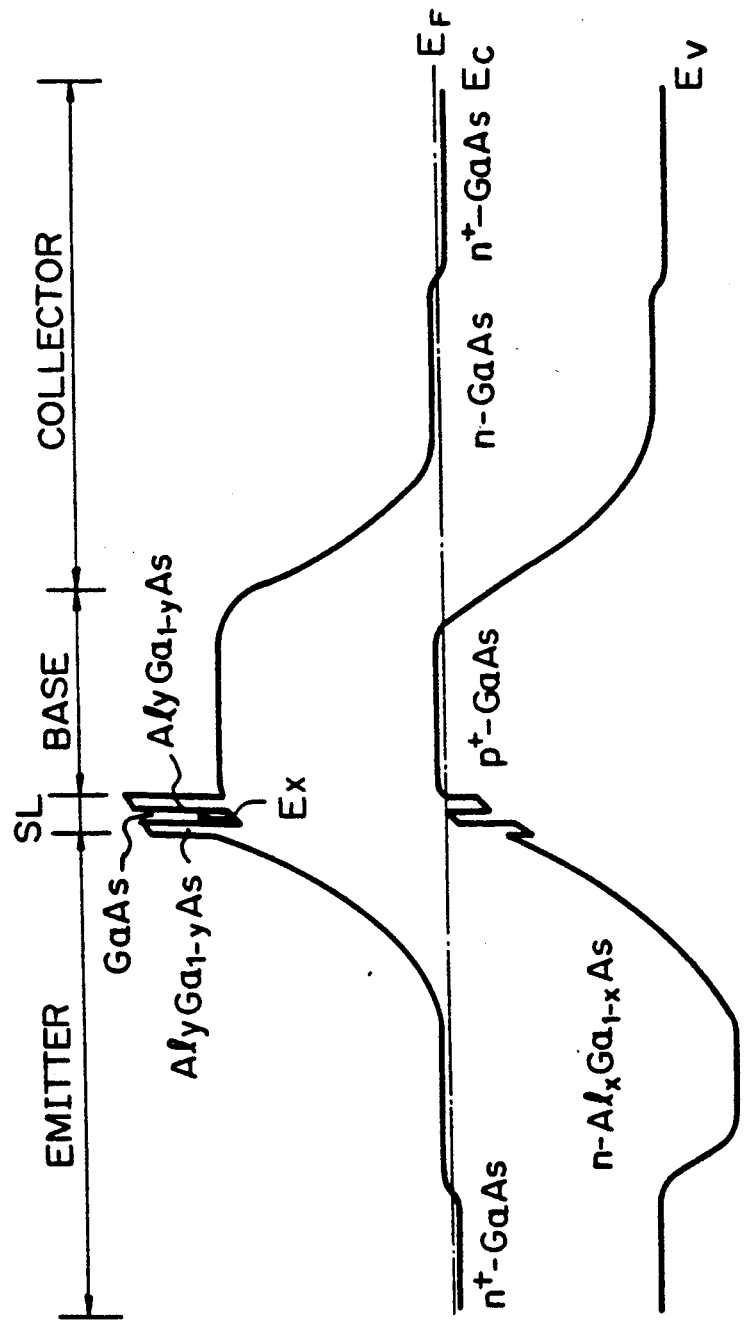
FIGS. 7 and 8 are energy state diagrams of the RHBT shown in FIG. 5.
Figure 8:
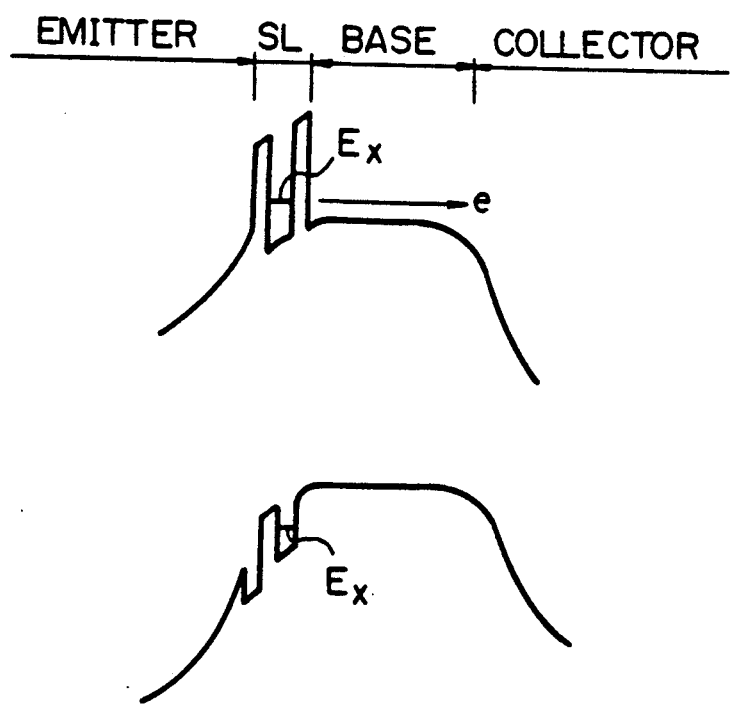

FIG. 7 is an energy band diagram of the RHBT when the bias voltage $V_{BE}$ is lower than $2 \cdot E_X/q$ or substantially zero. FIG. 8 is an enlarged graph energy band diagram of the RHBT when a bias voltage $V_{BE}$ between the emitter layer 17 and the base layer 14 is approximately equal to or higher than $2 \cdot E_X/q$ (where, $E_X$ represents an energy level of a sub-band at the quantum well layer 16, and q represents charges). In the drawings, $E_{FE}$ represents a quasi Fermi level; $E_X$ a sub-band energy; $E_C$ a bottom of a conduction energy band; and, $E_V$ an upper end of a valence (or filled) band.

As is apparent from FIGS. 4 and 5, the RHBT includes the superlattice structure providing the resonant-tunneling effect between the base layer 14 and the emitter layer, and a PN junction formed by the p-type base layer 14 and the n-type collector layer 13. On the other hand, there is no potential barrier between the base and the collector, as shown in FIGS. 2a to 2c. The PN junction between the base layer 14 and the collector layer 13 provides sufficient isolation for carriers, and thus functions as an isolation layer instead of a potential barrier in the resonant-hot electron transistor device.

When the bias voltage $V_{BE}$ is supplied, electrons in the emitter layer 17 are resonant-tunneled in the superlattice structure at the sub-band energy $E_X$, and injected into the base layer 14. Since there is no potential barrier, the injected electrons can almost reach the collector layer 13. As a result, high current gains can be realized.

In addition, the RHBT has the small leakage current characteristics of a base-collector PN junction. This enables the RHBT to be used at room temperature because excited thermionic electrons do not surmount the base-collector potential barrier, and thus a thermionic current is small.

Figure 9:
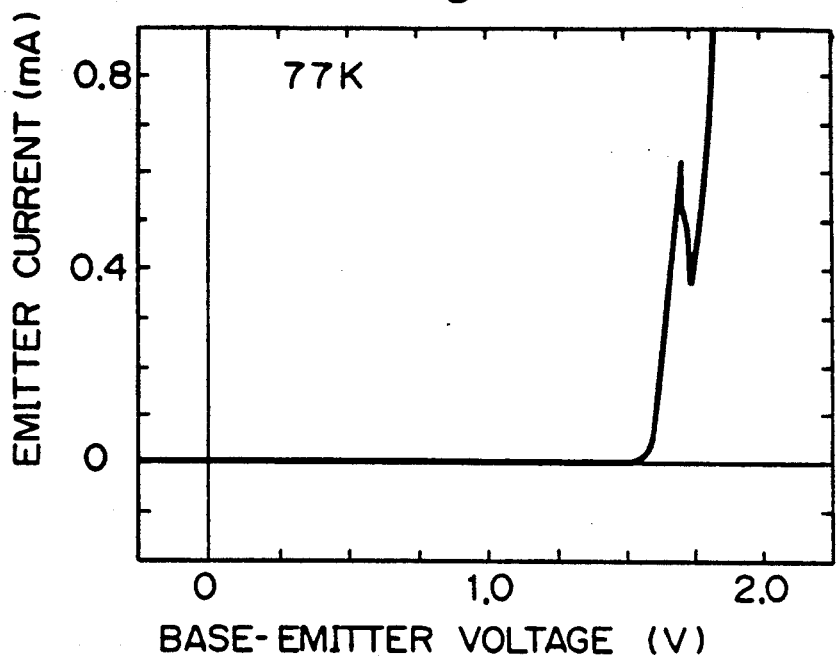
FIGS. 9 to 11 are graphs illustrating the characteristic curves of the RHBT shown in FIG. 5.
Figure 10:
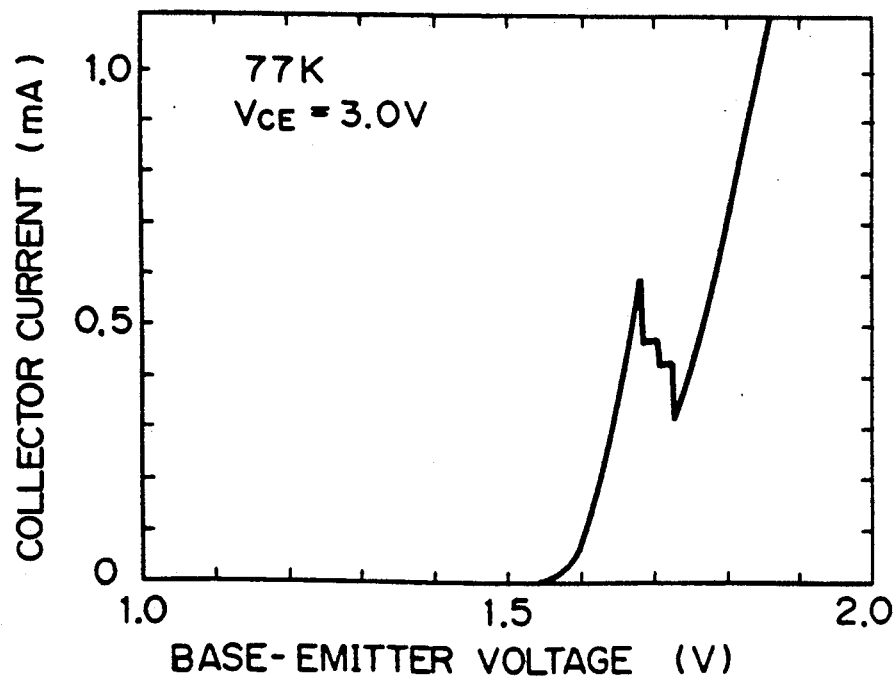
Figure 11:
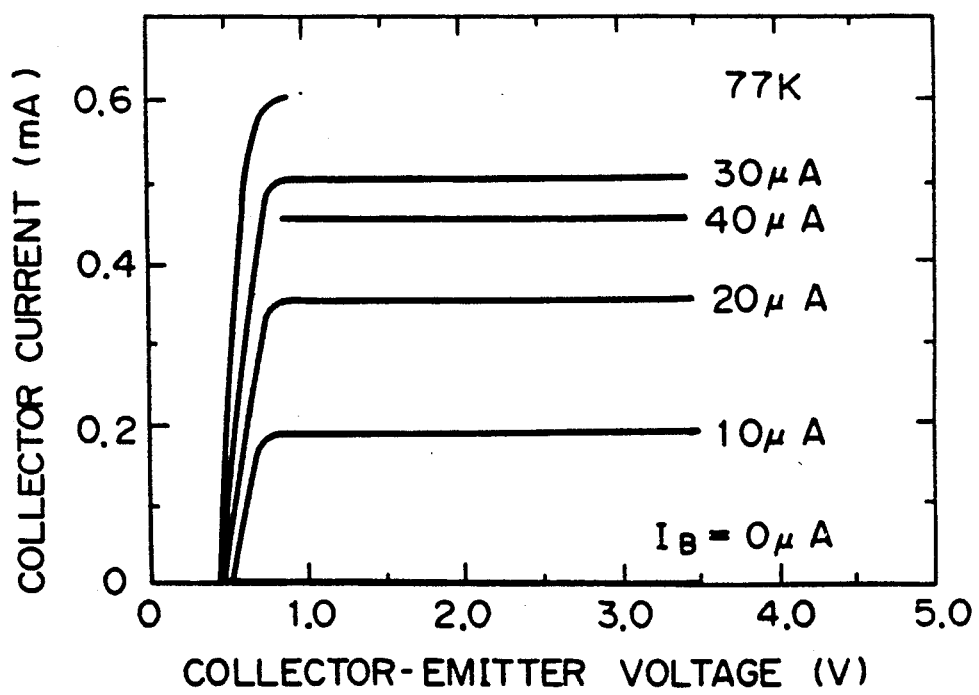

The characteristics of the RHBT in FIG. 5 are shown in FIGS. 9 to 11. FIG. 9 is a graph of the base-emitter I–V characteristics measured at 77° K. with the collector open. A negative differential resistance (NDR) region exists at approximately the base-emitter voltage $V_{BE}$ of 1.7 V. FIG. 10 is a graph of the characteristics of the collector current and the base-emitter voltage $V_{BE}$. The collector current as a function of the base-emitter voltage $V_{BE}$ exhibits a peak corresponding to the resonant-tunneling of the electrons. The peak-to-valley ratio is approximately 1.8 at 77° K., and 2.4 at 5° K. FIG. 11 is a graph of the collector current and the collector and emitter voltage ($I_C - V_{CE}$) characteristics at 77° K., in a common-emitter configuration, with the base current $I_B$ as a parameter. Note that there is an abrupt decrease in the collector current when the base current $I_B$ increases from 30 μA to 40 μA. This indicates that the RHBT has a negative current gain. The current gain $H_{fe}$ is typically observed to be 15 in the regular region, i.e. the positive current gain region, and the maximum current gain is 20. These values are far higher than those of the RHET.

The NDR characteristic of the RHBT can be applied to form a variety of circuits, in the same way as the RHET.

In addition, the electron resonance and the hole resonance can be adjusted in response to the AlAs mole fraction x of the emitter layers 17 of $Al_xGa_{1-x}As$, as shown in FIG. 6, by changing the bias voltage. Aluminium (Al) contributes to the generation of the electric field in the emitter layer, and accordingly, the AlAs mole fraction x varies with the height of the emitter layers. Examples of this feature are given as follows:

(a) When the fraction x of $Al_xGa_{1-x}As$ is 0.0, i.e., GaAs, the hole resonance and the electron resonance simultaneously rise.

This type of the RHBT can be used for a light emitting element.

Figure 12:
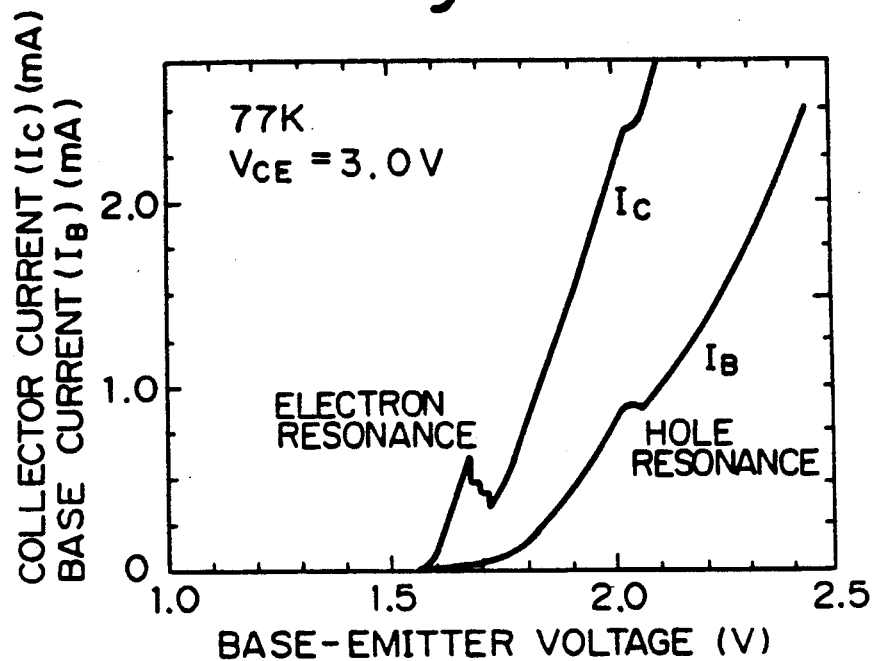
FIG. 12 is a graph of the resonance characteristics.

(b) When the fraction x is 0.14, i.e. $Al_{0.14}Ga_{0.86}As$, the electron resonance rises, and thereafter, the hole resonance rises, in response to the increase in the bias voltage. As shown in FIG. 12, the electron resonance is raised by the resonant-tunneling of electrons at a low sub-band energy. On the other hand, the hole resonance is raised by the resonant-tunneling of holes at a high sub-band energy. At the electron current resonance, collector current resonance occurs, and at the hole resonance, the base current resonance occurs. The base current resonance has n-shaped NDR characteristics.

(c) When the fraction x is 0.2, i.e., $Al_{0.2}Ga_{0.8}As$, the hole resonance rises, and thereafter, the electron resonance rises. This phenomenon is the reverse of that of the above case (b). At the hole resonance, the base current resonance occurs, and at the electron resonance, the collector current resonance occurs.

The collector current resonance has the n-shaped negative differential resistance characteristics as set forth above.

An example of the application of the RHBT of the type described above in (b) and having a base current n-shaped NDR characteristics will be described below.

Figure 13:
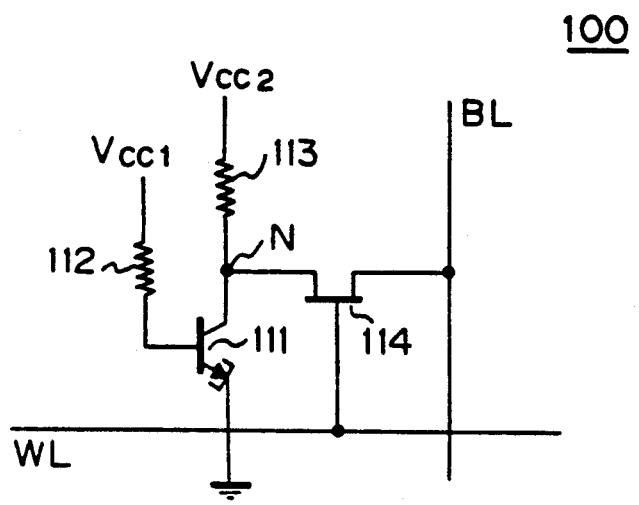
FIG. 13 is a circuit diagram of a memory cell using the RHBT according to an embodiment of the present invention.
Figure 14:
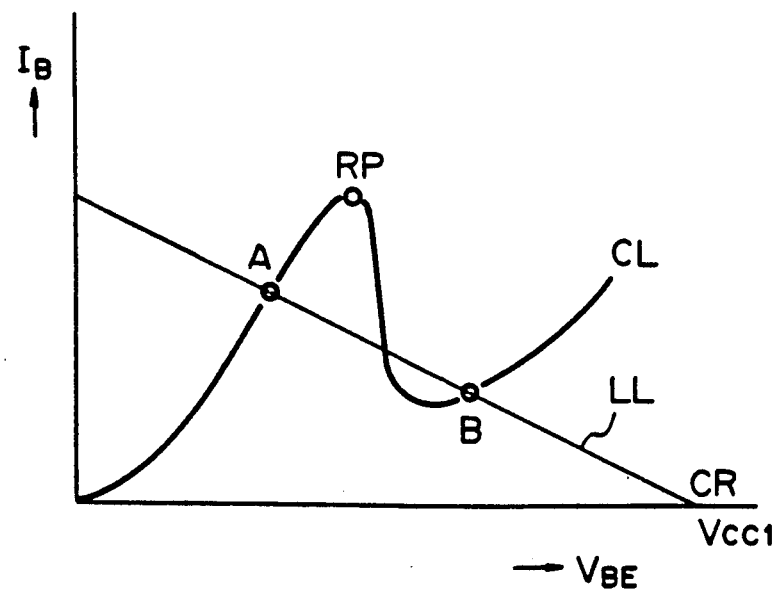
FIG. 14 is a graph representing the operational characteristics of the memory cell shown in FIG. 13.

FIG. 13 is a circuit diagram of a semiconductor memory cell 100. The memory cell 100 includes a RHBT 111, a current source resistor 112, a load resistor 113, and a transfer transistor 114 having a gate connected to a word line WL and a source connected to a bit line BL. A base of the RHBT 111 is supplied with a positive voltage $V_{CCI}$ through the resistor 112. The resistor 112 functions as a constant current source provided between the base and the emitter of the RHBT 111. A collector of the RHBT 111 is supplied with a positive voltage VCC2 through the resistor 113. The resistor 113 acts as a load, i.e., a dropping resistor. FIG. 14 is a graph of the characteristics of the memory cell shown in FIG. 13. In FIG. 14, the abscissa represents the base-emitter voltage $V_{BE}$, and the ordinate represents the base current $I_B$. A curve CL indicates the NDR characteristic of the RHBT 111. The characteristic curve CL has an n-shaped negative-differential characteristic of the base-emitter voltage $V_{BE}$ and the base current $I_B$. A first summit point RP in the curve CL represents a resonant-tunneling point. A line LL in the figure indicates a load line defined by the voltage $V_{CCI}$ supplied to the base of the RHBT 111 and a resistance value of the load resistor 113. The resistance value defines a gradient of the load line LL. The voltage $V_{CCI}$ defines an intersection CR intersecting the load line LL and the abscissa. The load line LL must be determined such that the line LL intersects a first positive slope line of the characteristic curve CL at a point A and a second positive slope line at a point B, to define bistable states of the memory cell at the points A and B. The graph in FIG. 7 represents an energy state at the point A in FIG. 14. The sub-band energy level $E_X$ at the quantum well layer 16 in FIG. 8 is higher than the energy level $E_{FE}$ at the emitter layer 17. The graph in FIG. 8 represents an energy state at the point B in FIG. 14. In both states at points A and B, a certain amount of electrons can reach the base layer 3 and the collector layer 1 from the emitter layer 5, and consequently, currents corresponding to the above electrons can flow therein. Here, the resistance value $R_B$ of the current resistor 12 is 1.5 KΩ, the resistance value $R_L$ of the load resistor 12 is 10 KΩ, the voltage $V_{CCI}$ of the constant current source is 1 V, and the voltage $V_{CC2}$ of the load is 1 V.

The operation of the semiconductor memory cell in FIG. 13 will be described with reference to FIGS. 15a, 15b, and 15c. In the drawings, the abscissas indicate an elapse of time. FIG. 15a is a graph of the voltage change $V_{BL}$ of the bit line BL; FIG. 15b is a graph of the voltage change $B_{WL}$ of the word line WL; and, FIG. 15c is a graph of the voltage change $V_N$ at a node N forming a common connection point for the collector of the RHBT 111, the load resistor 113, and a collector of the transfer transistor 114. As set forth above, the resistor 112 functions as the current source, and thus the current source 112 outputs a constant voltage L between the base and the emitter of the RHBT 111. Conversely, a voltage $V_{CE}$ between the collector and the emitter of the RHBT 111 may be varied by supplying a varying voltage to the bit line BL at each time during word line WL selections, as shown in FIGS. 15a and 15b. By varying the potential at the collector of the RHBT 111, the base current $I_B$ of the RHBT 111 flows in or out, resulting in a change in the base voltage. Accordingly, the bistable state may be controlled and used for a memory function. Referring back to FIGS. 15a to 15c, during a time $t_1$, the bit line BL is supplied with the voltage $V_{BL}$ of 0.5 V and the word line WL is supplied with the voltage $V_{WL}$ of 1.0 V. The transfer transistor 114 is turned ON by a high level of the voltage $V_{WL}$, and the voltage $V_N$ at the node N is brought to approximately 0.4 V. During a time $t_2$, the bit line BL is supplied with the voltage $V_{BL}$ of zero volts the word line WL is supplied with the voltage $V_{WL}$ of 1.0 V, and the transfer transistor 114 is turned ON by the high level of the voltage $V_{WL}$. Since, however, the voltage $V_{BL}$ of the bit line BL is zero volts, the voltage $V_N$ at the node N is approximately 0.1 V.

The above memory cell includes an RHBT latch circuit. Accordingly, it should be understood that a latch circuit using an RHBT also can be easily realized according to the present invention.

In the RHBT, positive holes can be resonant-tunneled. This resonant-tunneling of the holes causes the negative differential resistance in a base current.

Another example of the application of the RHBT of the type (c) described above and having collector current n-shaped NDR characteristics will be described below.

Figure 16:
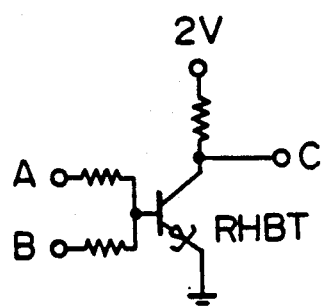
FIG. 16 is a circuit diagram of an Exclusive-NOR logic circuit including the RHBT shown in FIG. 5.

FIG. 16 is a circuit diagram of an Exclusive-NOR logic circuit including an RHBT device and three resistors. The resistances are 1 k ohm for the load and 50 ohms for the wired-or resistor. DC offset voltages of 0.35 V are applied to the inputs A and B. Note that output C is high only for A=B, indicating that the circuit has an Exclusive-NOR logic function. The small logic swing of 50 mV is due to increased valley current and increased peak voltage. The Exclusive-NOR function is widely used to build adders and parity detectors/generators. Considering that several switching FETs or bipolar transistors are required to build Exclusive-OR logic, the RHBT shows great promise for use in very high-speed, high-density integrated circuits.

Figure 17:
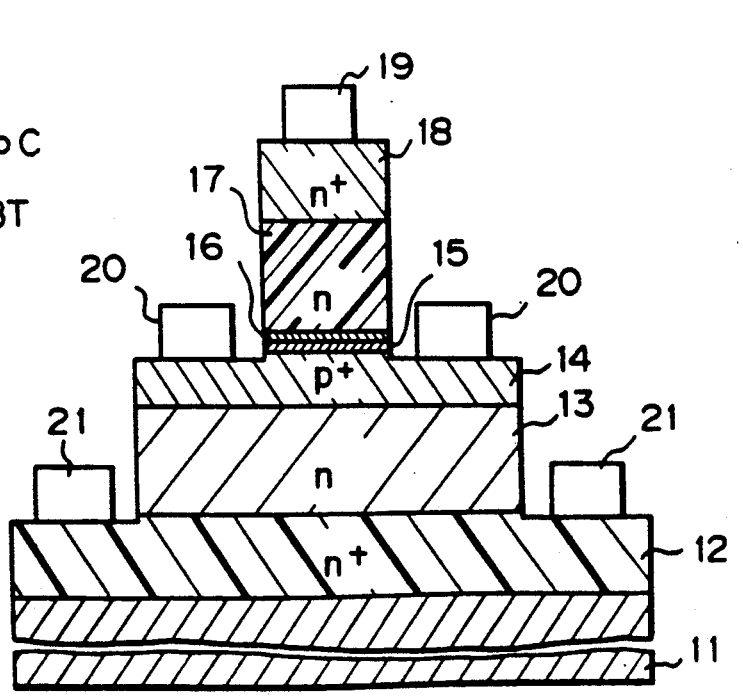
FIG. 17 is a sectional view of another semifinished RHBT of another embodiment in accordance with the present invention.
Figure 18:
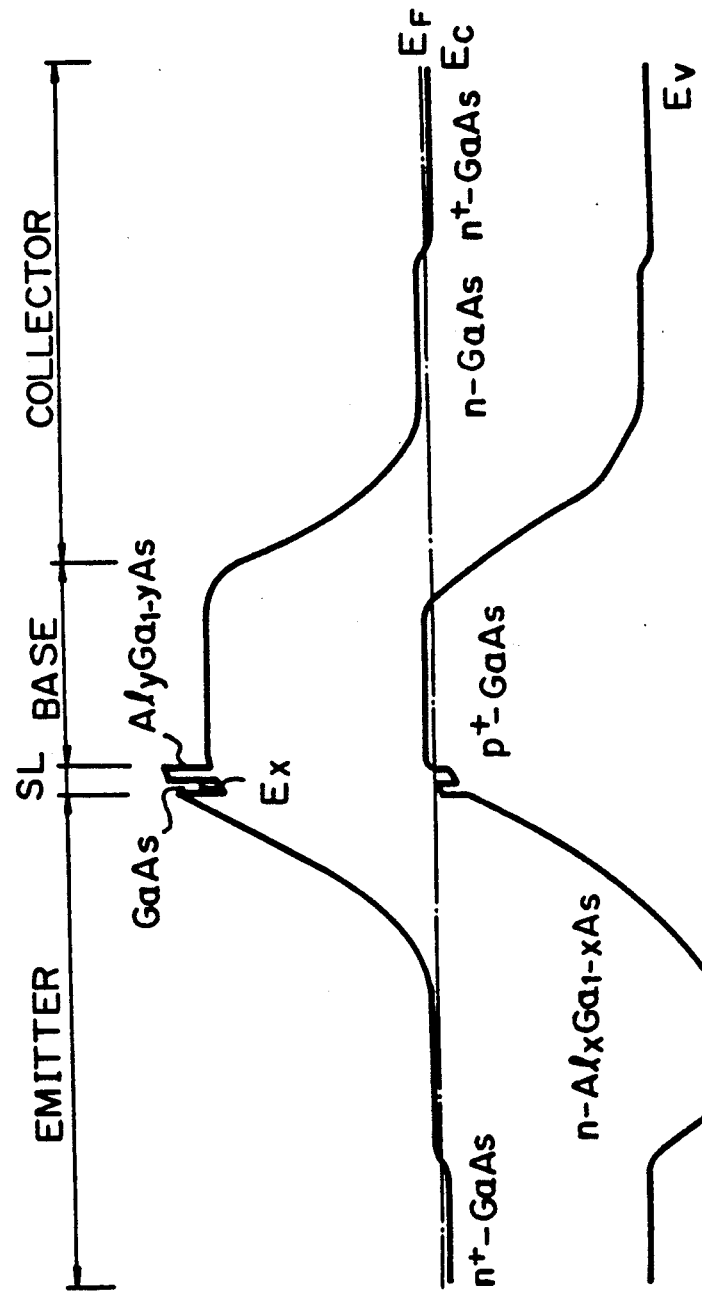
FIG. 18 is an energy state diagram of the RHBT shown in FIG. 17.

Referring again to FIGS. 4 and 5, other materials can be applied to the respective layers, and some examples of these materials are shown as follows:

(a) base layer 14
  (InGa)As, (InAlGa)As
(b) emitter layer 17
  (InAlGa)As, (InGa)As
(c) collector layer 13
  (InGa)As
(d) barrier layers 15A and 15B
  AlAs, (InAl)As, InP
(e) substrate 11
  InP Another embodiment of the RHBT is described with reference to FIGS. 17 and 18. FIG. 17 is a sectional view of another semifinished RHBT, and corresponds to FIG. 5. Compared with the RHBT in FIG. 5, in the RHBT in FIG. 17 the barrier layer 15B is removed from the RHBT in FIG. 5. Other elements are substantially the same as those in FIG. 5. FIG. 18 is a graph of an energy state of the RHBT in FIG. 17 and corresponds to FIGS. 7 and 8.

The modifications and the principle set forth above can be applied to the RHBT in FIG. 17.

In the above description, the RHBT 111 has only one sub-band energy level $E_X$. Nevertheless, the RHBT 111 may have a plurality of sub-band energy levels, and in this case, a characteristic curve may have a plurality of resonant-point peaks and a plurality of valleys. A plurality of memory cell states can be realized by using a RHBT, and accordingly, a multi-level memory cell can be realized. In addition, the RHBT 111 may have a plurality of quantum well(s).

In the above embodiments, the superlattice structure including the quantum well and functioning as a resonant carrier injector to the base can be formed between the emitter layer and the base layer, as set forth above, or in the emitter layer.

In addition, a resonant-tunneling hetero junction transistor device having a p-n-p structure can be achieved instead of the above n-p-n RHBT device.

Many widely different embodiments of the present invention may be constructed without departing from the spirit and scope of the present invention. It should be understood that the present invention is not limited to the specific embodiments described in this specification, except as defined in the appended claims.

We claim:

1. A resonant-tunneling hetero junction bipolar transistor device comprising:
   a collector semiconductor layer having a first conductivity type;
   a base semiconductor layer having a second conductivity type opposite the first conductivity type, a PN junction being formed at an interface between said base semiconductor layer and said collector semiconductor layer;
   an emitter semiconductor layer having the first conductivity type and formed on said base semiconductor layer; and
   a superlattice structure formed between said emitter semiconductor layer and said base semiconductor layer, said superlattice structure comprising:
   a first barrier layer contacting said emitter semiconductor layer, an energy level of said emitter semiconductor layer being lower than that of said first barrier layer for a carrier;
   a second barrier layer contacting said base semiconductor layer, an energy level of said base semiconductor layer being lower than that of said second barrier layer for the carrier; and
   a quantum well layer formed between said first and second barrier layers, an energy level of said quantum well layer being lower than that of said first and second barrier layers for the carrier, said quantum well layer defining a sub-band in which the carrier resonant tunnels therethrough.

2. A resonant-tunneling heterojunction bipolar transistor device according to claim 1, wherein the carriers being electrons and positive holes,
   a generation of electrons and positive holes being change in response to a mole of material in said emitter semiconductor layer.

3. A resonant-tunneling heterojunction bipolar transistor device according to claim 1, having a differential negative-resistance characteristic with at one resonant point in common between a current flowing in said base semiconductor layer and a voltage between said base and emitter semiconductor layers, and having at least two stable base current values, at both of the resonant point on said characteristic, defined by a changeable emitter voltage.

4. A resonant tunneling heterojunction bipolar transistor device according to claim 2, having a differential negative-resistance characteristic with at least one resonant point in common between a current flowing in said collector semiconductor layer and a voltage between said base and emitter semiconductor layers, and having at least two stable collector current values, at both sides of the resonant point on said characteristic, defined by a changeable base-emitter voltage.

5. A resonant tunneling heterojunction bipolar transistor device according to claim 2, wherein the material of said emitter semiconductor layer comprises aluminum.

6. A resonant tunneling heterojunction bipolar transistor device according to claim 1, wherein said emitter semiconductor layer comprises an n-type semiconductor material, said base semiconductor layer comprises a p-type semiconductor material, and said collector semiconductor layer comprises an n-type semiconductor material.

7. A resonant tunneling heterojunction bipolar transistor device according to claim 1, wherein said emitter semiconductor layer comprises a p-type semiconductor material, said base semiconductor layer comprises an n-type semiconductor material, and said collector semiconductor layer comprises a p-type semiconductor material.

8. A resonant-tunneling heterojunction bipolar transistor device comprising:
   an emitter semiconductor layer having an n-type conductivity and having a first conduction band;
   a base semiconductor layer having a p-type conductivity and having a second conduction band;
   a collector semiconductor layer having the n-type conductivity and formed on said base semiconductor layer so as to form a PN junction at an interface between said base semiconductor layer and said collector semiconductor layer; and
   a superlattice structure formed between said emitter semiconductor layer and said base semiconductor layer, said superlattice structure comprising:

a first barrier layer contacting said emitter semiconductor layer and having a third conduction band, an energy level of the first conduction band of said emitter semiconductor layer being lower than that of the third conduction band of said first barrier layer;

a second barrier layer contacting said base semiconductor layer and having a fourth conduction band, an energy level of the second conduction band of said base semiconductor layer being lower than that of the fourth conduction band of said second barrier layer; and a quantum well layer formed between said first and second barrier layers, said quantum well layer having a sub-band, a number of electrons, resonant-tunneling from said emitter semiconductor layer toward said base semiconductor layer through said first layer, said sub-band and said second barrier layer, is increased by a resonant-tunneling effect when a base-emitter voltage is applied so that a lowest energy level of a conduction band of said emitter semiconductor layer is approximately equal to an energy level of said sub-band in said quantum well layer.

9. A resonant-tunneling heterojunction bipolar transistor device according to claim 8, wherein said superlattice structure is formed at substantially the entire interface between said emitter and base semiconductor layers.

10. A resonant-tunneling heterojunction bipolar transistor device according to claim 8, further comprising a base electrode formed in contact with said base semiconductor layer and separated from said superlattice structure.

* * * * *

UNITED STATES PATENT AND TRADEMARK OFFICE
CERTIFICATE OF CORRECTION

PATENT NO. : 5,027,179
DATED : JUNE 25, 1991
INVENTOR(S) : NAOKI YOKOYAMA ET AL.

sheet 1 of 2

It is certified that error appears in the above-identified patent and that said Letters Patent is hereby corrected as shown below:

TITLE PAGE, Col. 2, after line 20, insert the following which were inadvertently omitted by the Patent Office:

--F. Capasso et al., "Resonant-Tunneling Transistor with Quantum Well Base and High-Energy Injection: A New Negative Differential Resistance Device," Aug. 1, 1985, J. APPL. PHYS. 58(3), pps. 1366-1368.

N. Yokoyama et al., "A New Functional Resonant-Tunneling Hot Electron Transistor," Nov. 1985, JAPANESE JOURNAL OF APPLIED PHYS., Vol. 24, No. 11, pp. L853-L854--.

TITLE PAGE, Col. 2, [57] ABSTRACT,
line 10, "faces." should be --faces the base layer.--.

Col. 3, line 1, "graphs illustrating an" should be deleted;
line 2, "digrams" should be --diagrams--;
line 15, "graphs illustrating the" should be deleted.

Col. 4, line 38, "characteristics the" should be --characteristics of the--'
line 58, "resonant-tunneled" should be --(resonant-tunneled)--.

Col. 5, line 27, "ohmic-connected" should be --ohmically-connected--.

UNITED STATES PATENT AND TRADEMARK OFFICE
CERTIFICATE OF CORRECTION

PATENT NO. : 5,027,179
DATED : JUNE 25, 1991        sheet 2 of 2
INVENTOR(S) : NAOKI YOKOYAMA ET AL.

It is certified that error appears in the above-identified patent and that said Letters Patent is hereby corrected as shown below:

Col. 6, line 10, "graph" should be deleted;
         line 62, "$H_{fe}$" should be --$h_{fe}$--.

Col. 7, line 47, "VCC2" should be --$V_{cc2}$--.

Col. 10, line 17, "change" should be --changed--;
          line 17, "mole of" should be --mole fraction of--;
          line 21, "at one" should be --at least one--;
          line 25, "both of" should be --both sides of--;
          line 26, "changeable" should be --changeable base--.

Signed and Sealed this

Twelfth Day of January, 1993

Attest:

DOUGLAS B. COMER

Attesting Officer        Acting Commissioner of Patents and Trademarks